(12) United States Patent
Halik et al.

(10) Patent No.: US 7,326,957 B2
(45) Date of Patent: Feb. 5, 2008

(54) THIN FILM FIELD EFFECT TRANSISTOR WITH GATE DIELECTRIC MADE OF ORGANIC MATERIAL AND METHOD FOR FABRICATING THE SAME

(75) Inventors: Marcus Halik, Erlangen (DE); Hagen Klauk, Erlangen (DE); Ute Zschieschang, Erlangen (DE); Günter Schmid, Hemhofen (DE)

(73) Assignee: Infineon Technologies AG, Neubiberg (DE)

( * ) Notice: Subject to any disclaimer, the term of this patent is extended or adjusted under 35 U.S.C. 154(b) by 73 days.

(21) Appl. No.: 11/134,512

(22) Filed: May 23, 2005

(65) Prior Publication Data
US 2005/0260803 A1 Nov. 24, 2005

(30) Foreign Application Priority Data
May 24, 2004 (DE) ........................ 10 2004 025 423

(51) Int. Cl.
*H01L 29/08* (2006.01)
(52) U.S. Cl. .............. 257/40; 257/E39.007; 257/347; 438/99
(58) Field of Classification Search ............ 257/40, 257/347, E39.007; 438/99
See application file for complete search history.

(56) References Cited

U.S. PATENT DOCUMENTS 6,768,132 B2 * 7/2004 Smith et al. ............... 257/40

2006/0011909 A1 * 1/2006 Kelley et al. ............... 257/40

FOREIGN PATENT DOCUMENTS

| WO | WO 01/01502 A2 | 1/2001 |
| WO | WO 03/023877 A2 | 3/2003 |
| WO | WO 03/030278 A2 | 4/2003 |

OTHER PUBLICATIONS

David J. Gundlach et al., "High-Mobility, Low Voltage Organic Thin Film Transistors," Center for Thin Film Devices, and Electronic Materials and Processing Research Laboratory, The Pennsylvania State University, (c) 1999 IEEE.
Jiyoul Lee et al., "Pentacene thin-film transistors with Al2O3+x gate dielectric films deposited on indium-tin-oxide glass," Applied Physics Letters, vol. 83, No. 13, Sep. 29, 2003.

(Continued)

*Primary Examiner*—Richard A. Booth
(74) *Attorney, Agent, or Firm*—Edell, Shapiro & Finnan, LLC

(57) ABSTRACT

The gate dielectric layer of a thin film field effect transistor is formed as a multilayer layer system having at least one self assembling molecular monolayer (SAM) and a dielectric polymer layer made of an insulating polymer. With comparatively small layer thicknesses of 10 to 50 nanometers, the multilayer gate dielectric layer ensures low leakage currents and enables failsafe operation of the thin film field effect transistor at low supply voltages of less than 5 volts. The gate dielectric layer is robust toward voltages of up to approximately 20 volts and permits the use of a multiplicity of different materials for realizing an underlying electrode.

14 Claims, 4 Drawing Sheets

OTHER PUBLICATIONS

Hagen Klauk et al., "High-mobility polymer gate dielectric pentacene thin film transistors," Journal of Applied Physics, vol. 92, No. 9, Nov. 1, 2002.

G. H. Gelinck et al., "High-performance all-polymer integrated circuits," Applied Physics Letters, vol. 77, No. 10, Sep. 4, 2000.

P. Mach et al., "Monolithically integrated, flexible display of polymer-dispersed liquid crystal driven by rubber-stamped organic thin-film transistors," Applied Physics Letters, vol. 78, No. 23, Jun. 4, 2001.

David J. Gundlach et al., "Improved Organic Thin Film Transistor Performance Using Chemically-Modified Gate Dielectrics," The Department of Electrical Engineering, Center for Thin Film Devices, The Pennsylvania State University, Proceedings of SPIE vol. 4466 (2001).

* cited by examiner ent al., Applied Physic Letters, Vol. 77, No. 10 (2000), p. 1487, "Monolithically Integrated Flexible Display of Polymer-Dispersed Liquid Crystal Driven by Rubber-Stamped Organic Thin-Film Transistors," Mach, et al., Applied Physics Letters, Vol. 78, No. 23, (2001), p. 3592, and "High-Mobility Polymer Gate Dielectric Pentacene Thin Film Transistors," Klauk et al., Journal of Applied Physics, Vol. 92, No. 9. (2002), p. 5259, describe, as an alternative to inorganic gate dielectrics, insulating polymers for fabrication of organic thin film field effect transistors.

THIN FILM FIELD EFFECT TRANSISTOR WITH GATE DIELECTRIC MADE OF ORGANIC MATERIAL AND METHOD FOR FABRICATING THE SAME

CROSS-REFERENCE TO RELATED APPLICATIONS

This application claims priority under 35 U.S.C. §119 to German Application No. DE 10 2004 025 423.0, filed on May 24, 2004, and titled "Thin Film Field Effect Transistor with Gate Dielectric Made of Organic Material and Method for Fabricating It," the entire contents of which are hereby incorporated by reference.

FIELD OF THE INVENTION

The invention relates to a thin film field effect transistor having a gate electrode, a source electrode, and a drain electrode, and to a method for fabricating a thin film field effect transistor having a gate dielectric layer made of organic material.

BACKGROUND

Thin film field effect transistors (thin film transistors TFTs) are suitable for a multiplicity of applications pertaining to semiconductor electronics that require low production costs, flexible or unbreakable carrier substrates, or fabrication of transistors and integrated circuits over large areas. TFTs are formed based on organic and inorganic semiconductor materials, such as vapor-deposited organic pentacene or inorganic silicon, and are suitable, for instance, as pixel control elements in active matrix screens and optical sensors and for fabrication of extremely inexpensive integrated circuits, such as used, for instance, in the labeling and identification of merchandise and goods.

Broad field of use of TFTs, and, in particular, those based on organic semiconductor materials, is the use of the lowest possible supply voltages of less than 10 volts.

Sufficient modulation of the charge carrier density in the semiconductor body of the transistor requires a sufficiently strong electric field. Since the field strength of the electric field decreases with the thickness of the gate dielectric layer, gate dielectric layers that are as thin as possible are required for operating thin film field effect transistors at low supply voltages and thus also at low gate voltages.

On the other hand, the gate dielectric layer is intended to ensure a sufficiently good electrical insulation between the semiconductor body and the gate electrode. In the case of organic thin film field effect transistors (organic TFTs, OFETs) with a semiconductor body made of an organic material, for the case where the organic semiconductor material is applied to the gate dielectric layer, the material of the gate dielectric layer is intended to enable an optimum molecular orientation of the subsequently deposited organic semiconductor material.

For example, "High-mobility, Low Voltage Organic Thin Film Transistors," Gundlach et al., Technical Digest—International Electron Devices Meeting (1999), p. 111, describes silicon oxide as material for a gate dielectric layer where the silicon oxide is deposited by ion beam sputtering at a substrate temperature of 80 degrees Celsius. Further, "Pentacene Thin-film Transistors with $Al_2O_{3+x}$ Gate Dielectric Films Deposited on Indium-Tin-Oxide Glass," Lee, et al., Applied Physics Letters, Vol. 83, No. 13 (2003), p. 2689 describes gate dielectric layers made of aluminum oxide deposited by cathode beam sputtering and without substrate heating.

Layers of inorganic dielectrics deposited at temperatures of less than approximately 200 degrees Celsius generally have a relatively high density of defects (pin holes). In order to ensure sufficiently good insulator properties despite the comparatively high defect density, it is necessary to provide gate dielectric layers made of inorganic materials in each case as relatively thick layers of more than 100 nanometers, so that comparatively high supply voltages of more than 10 volts are necessary for operation of such circuits.

"High Performance All-Polymer Integrated Circuits," Gelinck

Polymers generally have the advantage that they can be processed at relatively low temperatures of below approximately 200 degrees Celsius. In a disadvantageous manner, the insulator properties of thin layers of polymeric dielectrics deteriorate on account of leakage currents, as the layer thickness decreases, to a greater extent than in the case of inorganic dielectrics. Therefore, fabricating organic field effect transistors, polymeric dielectrics are used only in the form of comparatively thick layers having a thickness of more than 100 nanometers. Integrated circuits having organic field effect transistors with polymeric gate dielectrics require the use of comparatively high supply voltages. In pentacene layers deposited on polymeric dielectrics, the mobility of the charge carriers is similar or higher in comparison with inorganic dielectrics.

Organic field effect transistors with self assembling molecular monolayers (self assembling monolayers, SAM) as gate dielectric, and synthesis methods for a compound for forming a self assembling monolayer have been described. In contrast to customary polymeric dielectrics, self assembling molecular monolayers are distinguished by very low leakage currents despite a layer thickness of a few nanometers. A specific leakage current of approximately 1 $\mu A/cm^2$ results given an electric field strength of 10 MV/cm. Given a layer thickness of approximately 2 to 3 nanometers, SAM dielectrics permit the use of very low supply voltages of between 1 and 3 volts. SAM dielectrics are disadvantageously comparatively sensitive toward high voltages. If the applied voltage exceeds a value of approximately 3.5 volts, then a gate dielectric layer with an SAM dielectric may already be irreversibly damaged (dielectric breakdown).

"Improved Organic Thin Film Transistor Performance Using Chemically-Modified Gate Dielectrics," Gundlach et al., Organic Field Effect Transistors—Proceedings of SPIE, Vol. 4466, (2001), pp. 54-64 describes a molecular monolayer made of octadecyltrichlorosilane (OTS) as an interface layer between an inorganic gate dielectric layer and an organic semiconductor layer subsequently deposited on the gate dielectric layer. The interface layer adapts the surface properties of the gate dielectric layer made of the inorganic dielectric to the semiconductor material in a targeted manner, thereby obtaining an optimum molecular orientation in the organic semiconductor layer. An optimum molecular orientation in the organic semiconductor layer ensures a high mobility of the charge carriers in the semiconductor. The defect density in the inorganic gate dielectric layer remains unaffected by this in the case of processing below 200 degrees Celsius, thus resulting, in this case as well, in the need for a comparatively thick gate dielectric layer made of the inorganic dielectric. Such an arrangement of a monolayer on a dielectric layer influences the semiconductor orientation in the semiconductor material, but not the supply voltage of the thin film field effect transistor.

Providing a thin film field effect transistor is processed at process temperatures of below approximately 200 degrees Celsius enables the use of supply voltages of less than approximately 5 volts and is robust toward voltages at the electrodes of up to approximately 20 volts. A method for fabricating such a thin film field effect transistor is desirable.

SUMMARY

A thin film field effect transistor has a semiconductor body arranged between a source electrode and a drain electrode. The charge carrier density at least in a section of the semiconductor body is controlled by a potential at a gate electrode. The gate electrode, the source electrode, and the drain electrode are each made of electrically conductive material. The gate electrode is spaced apart from the semiconductor body by a gate dielectric having a self assembling molecular monolayer.

According to the invention, the semiconductor body is separated from the gate electrode by a multilayer gate dielectric layer including at least the molecular self assembling monolayer and an organic polymer layer. In this case, the monomolecular gate dielectric (SAM) is reinforced at least by a 5 nanometer thick polymer layer made of an electrically insulating polymer.

In the case of a gate dielectric layer with a self assembling molecular monolayer, the layer thickness is predefined by the length of the molecule used and restricted to, for example, approximately 2 to 3 nanometers, thus resulting in a comparatively high sensitivity toward voltages of greater than approximately 3 volts.

The invention's construction of the gate dielectric layer opens up the possibility of increasing the layer thickness of the gate dielectric layer in a targeted manner, so that the gate dielectric layer becomes robust toward voltages of up to approximately 20 volts. Given an overall layer thickness of the gate dielectric of 10 to 20 nanometers, a low supply voltage of approximately 2 to 5 volts advantageously results.

The embodiment of the gate dielectric layer according to the invention permits the use of a multiplicity of different materials for the gate electrode. Thus, self assembling molecular monolayers that have been deposited on sufficiently smooth surfaces are distinguished by outstanding insulator properties with leakage currents of approximately 1 µA/cm$^2$ at a field strength of 10 MV/cm and a breakdown voltage of approximately 3.5 volts, corresponding to a field strength of approximately 14 MV/cm. A sufficiently smooth surface is, for instance, monocrystalline silicon covered with a thin native oxide layer.

The insulator properties of self assembling monolayers deteriorate significantly if the respective monolayer is provided on a comparatively rough surface, for instance, on polycrystalline metal surfaces, for instance, aluminum. Unevennesses and grain boundaries on the surface of the metal layers increase the defect density in the molecular monolayer and consequently impair the insulator properties thereof.

In the thin film field effect transistor according to the invention, defects in the molecular monolayer are closed by the material of the polymer layer. The insulator properties of a gate dielectric layer, in particular, of one which is provided on a metal surface, are significantly improved according to the invention. The use of a multiplicity of different materials for the gate electrodes is possible.

The high thermal, chemical, and mechanical stability of the multilayer gate dielectric layer according to the invention is furthermore advantageous.

The gate dielectric layer is, for example, provided with a total thickness of between 10 and 50 nanometers. This results in a high dielectric strength of approximately 25 volts at a comparatively low required supply voltage of up to approximately 2 volts. Preferably, the polymer of the polymer layer is crosslinked and the mechanical and chemical stability of the insulating polymer layer is improved.

Suitable material for the insulating polymer layer includes organic polymers and polymer mixtures having dielectric properties processed at process temperatures of less than 200 degrees Celsius to form thin, homogeneous and closed layers a few nanometers thick. The polymer of the insulating polymer layer is, for example, poly-4-vinylphenol, a copolymer thereof, or polystyrene.

The self assembling molecular monolayer is provided between the gate electrode and the dielectric polymer layer, and covalently bonded to the gate electrode surface. The dielectric polymer layer fills imperfections in the monolayer and thus enables the use thereof on metals or polycrystalline conductive semiconductor materials and, consequently, the use of metals and polycrystalline semiconductor materials for the gate electrode.

In the case of an opposite arrangement having the order gate electrode, dielectric polymer layer and self assembling molecular monolayer, although a molecular layer can be formed on a suitable dielectric polymer layer, the lower density and irregular distribution of anchor groups at the polymer surface for covalent bonding of the molecules of the monolayer mean that the latter does not have the insulator properties of monolayers directly deposited on the gate electrode material.

The material of the monolayer is, for example, a compound of the general formula $R_1Si(R_2)_3$, where $R_1$ is an alkyl group having 10 to 30 carbon atoms which may optionally be substituted by one or more heteroatoms or aryl groups, and $R_2$ is a halogen or an alkoxy group, derived from an alcohol having 1 to 4 carbon atoms.

The material of the self assembling molecular monolayer is particularly preferably (18-phenoxyoctadecyl) tri-chlorosilane, ([18-(1',1"-biphenyl-4'-yloxy)octadecyl]tri-chlorosilane, (17-thien-2'-ylheptadecyl)trichlorosilane, (17-thien-2'-yloctadecyl)trichlorosilane or 4-(18'-trichlorosilyloctadecyloxy)benzonitrile.

The semiconductor body of the thin film field effect transistor is, for example, made of an organic semiconductor material. Inorganic semiconductor layers (e.g., amorphous silicon) which can be deposited at temperatures of less than 200° C. are also suitable. The thin film field effect transistor can then be fabricated continuously at relatively low process temperatures of less than approximately 200 degrees Celsius. The gate dielectric layer is of relatively high quality with relatively small layer thicknesses and ensures a high dielectric strength on relatively rough, polycrystalline metal, or semiconductor surfaces.

A flexible film or glass is, for example, provided as the carrier substrate. The thin film field effect transistor according to the invention is, for example, formed on a polymer film. Depending on the embodiment of the thin film field effect transistor with either source and drain electrodes underlying the semiconductor body (bottom-contact TFT) or source and drain electrodes overlying the semiconductor body (top-contact TFT), two methods are afforded for fabricating the thin field film effect transistor according to the invention.

According to a first method, a conductive material is applied to a carrier substrate and patterned. A gate electrode is formed from the conductive material. A self assembling molecular monolayer (SAM) is applied to the surface of the gate electrode. The SAM is applied either from an organic solvent or from the gas phase. A dielectric polymer layer is applied to the molecular monolayer. The dielectric polymer layer includes an insulating polymer or a polymer mixture. The dielectric polymer layer forms a homogeneous, closed layer having an exemplary thickness of at most 10 to 50 nanometers. An electrode layer made of a conductive material is applied to the polymer layer and patterned. The electrode layer gives rise to source and drain electrodes that are spaced apart from one another above the gate electrode. An organic semiconductor material is subsequently applied. The semiconductor material bears on the dielectric polymer layer between the source and drains electrodes and forms a semiconductor body of the thin film field effect transistor.

According to another method according to the invention, instead of the electrode layer, the organic semiconductor material is applied to the dielectric polymer layer and an electrode layer made of a conductive material is applied to the organic semiconductor material and patterned. Source and drain electrodes that are spaced apart from one another above the gate electrode on the electrode layer are created.

The dielectric polymer layer is, for example, applied from an organic solvent, for instance, by spinning on, spraying on, or printing. The polymer of the dielectric polymer layer is cross linked in order to increase the mechanical, chemical, and thermal stability.

It is now possible to fabricate integrated circuits on glass or flexible polymeric substrates at relatively low process temperatures. The high-quality gate dielectrics formed in this case can be provided with small layer thicknesses, so that the integrated circuits can be operated at supply voltages of less than approximately 40 volts, a high dielectric strength of the gate dielectric layer simultaneously being ensured even on relatively rough, polycrystalline metal surfaces.

BRIEF DESCRIPTION OF THE DRAWINGS

The invention is explained in more detail below with reference to figures which show exemplary embodiments of the invention, in which.

DETAILED DESCRIPTION

Figure 1:
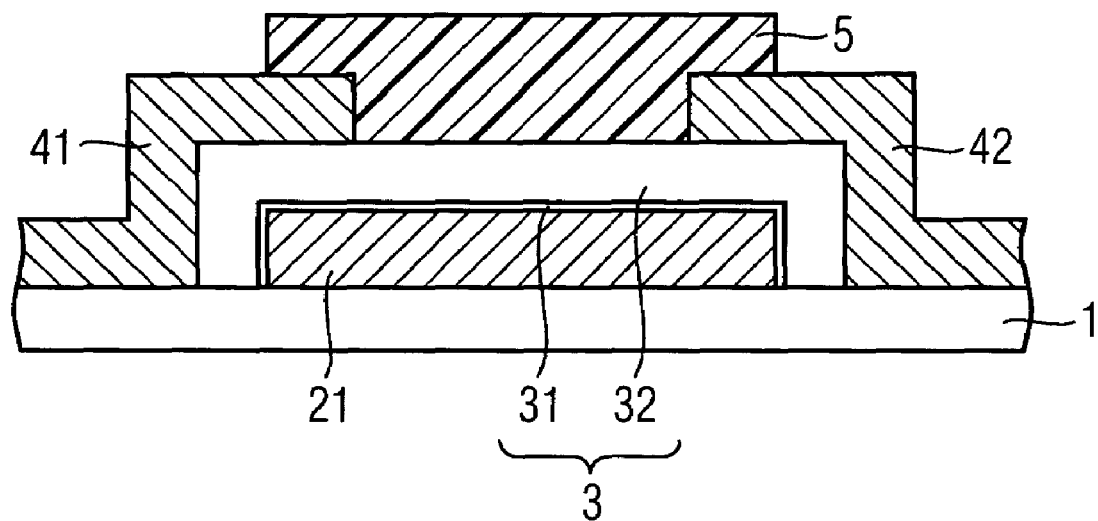
FIG. 1 shows a cross section through a thin film field effect transistor according to a first exemplary embodiment with bottom source and drain contacts.

FIG. 1 shows the schematic construction of an organic field effect transistor with bottom source and drain contacts and a two-layer gate dielectric layer in cross section.

The thin film field effect transistor is formed on a carrier substrate 1, for instance, a polymer film. The thin film field effect transistor includes a source electrode or a source contact 41, a drain electrode or a drain contact 42, and a gate electrode or a gate contact 21. The gate electrode 21 bears on the carrier substrate 1 and is enveloped by a gate dielectric layer 3. The source contact 41 and the drain contact 42 bear in sections on the gate dielectric layer 3 and are spaced apart from one another above the gate electrode 21 in sections by a semiconductor body 5 made of a semiconductor material.

During operation of the thin film field effect transistor, the charge carrier distribution in the semiconductor body 5 is controlled by a potential at the gate electrode 21, so that it is possible to control a drain current ID flowing between the source electrode 41 and the drain electrode 42 through the semiconductor body 5.

The gate dielectric layer 3 includes a self assembling molecular monolayer 31 having a layer thickness of approximately 2 to 3 nanometers and a dielectric polymer layer 32 having a layer thickness of approximately 10 to 50 nanometers.

The comparatively small overall layer thickness of the gate dielectric layer 3 makes it possible to operate the thin film field effect transistor at low supply voltages.

Figure 2:
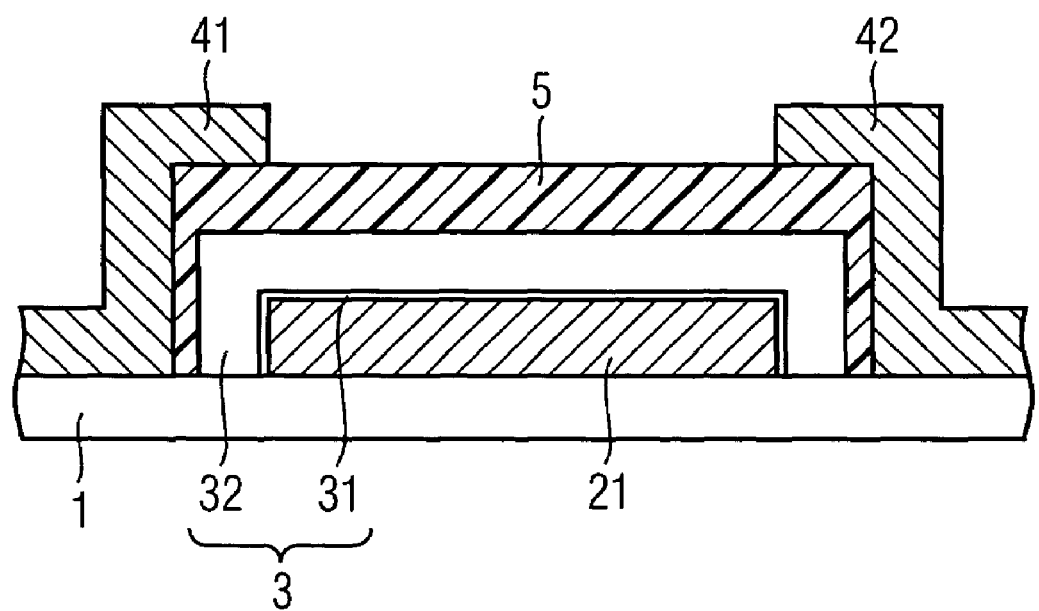
FIG. 2 shows a cross section through a thin film field effect transistor according to a second exemplary embodiment of the invention with overlying source and drain contacts.

The thin film field effect transistor illustrated in FIG. 2 differs from that of FIG. 1 through the arrangement of the source contact 41 and of the drain contact 42, which in each case bear in sections on the semiconductor body 5.

Figure 3:
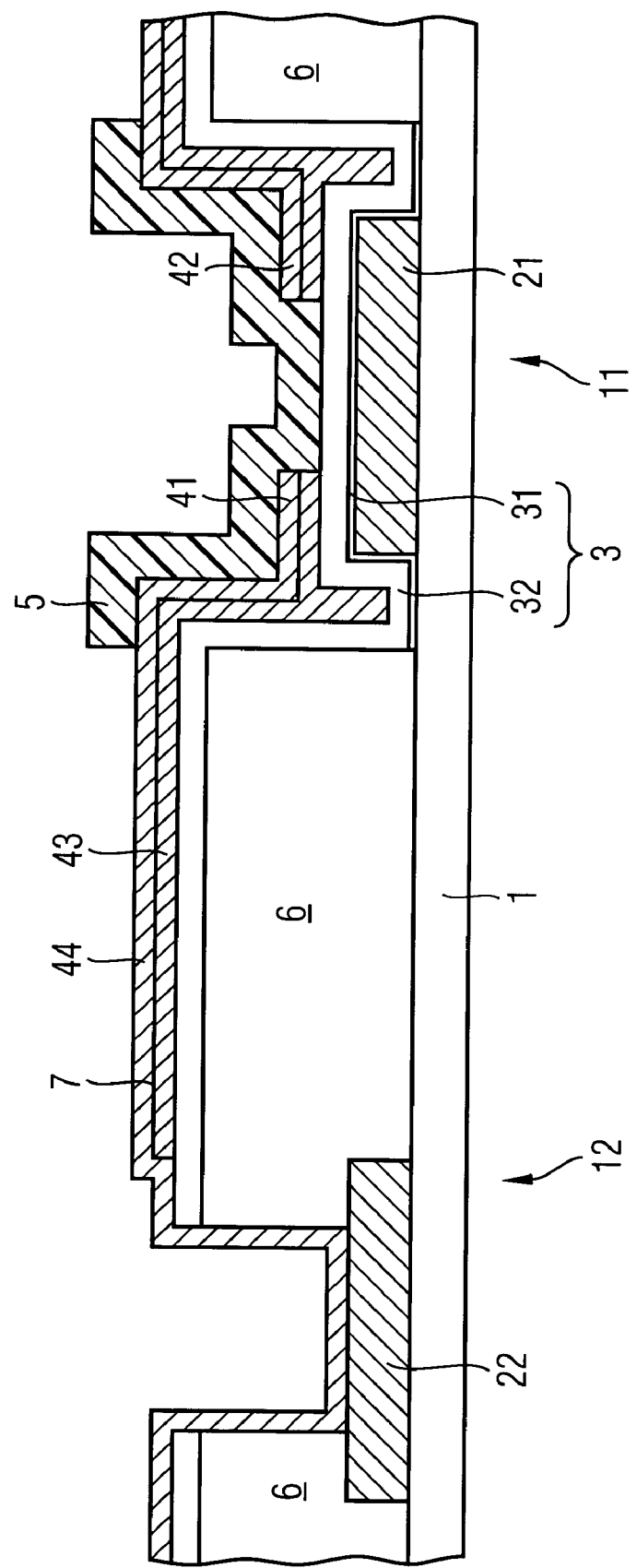
FIG. 3 shows a cross section through an integrated circuit with a thin film field effect transistor according to a third exemplary embodiment of the invention.

FIG. 3 illustrates an integrated circuit based on an organic thin film field effect transistor with a two-layer gate dielectric in cross section.

In this case, the illustration shows an interconnect region 12 and also a TFT region 11 of the integrated circuit. In the interconnect region 12, a contact 22 is arranged on the carrier substrate 1. The contact is connected to a source electrode 41 of a thin film field effect transistor formed in the TFT region 11.

The thin film field effect transistor formed in the TFT region 11 corresponds in terms of its construction to that of FIG. 1. The gate electrode 21, like the contact 22, is made of aluminum. The source electrode 41 and a drain electrode 42 of the thin film field effect transistor are formed as sections of a double layer comprising a bottom 43 and a top 44 gold coating. The gold coatings 43, 44 connect the source electrode 41 to the contact 22. The gate dielectric layer 3 spaces apart the gate electrode 21 of the thin film field effect transistor from the semiconductor layer 5 and includes a self assembling molecular monolayer 31 and a dielectric polymer layer 32.

If gate dielectric layers having a relatively large layer thickness of more than 100 nanometers are used in organic integrated circuits, then the gate dielectric functions outside the TFT as a field dielectric for the insulation of interconnects or conductive structures within one metallization plane or for the insulation of successive metallization planes from one another.

If a double layer including molecular self assembling monolayer and a polymer layer is provided as the gate dielectric layer, then the field dielectric is provided at least partly in a different way than the gate dielectric layer in order to sufficiently capacitively decouple the metallization planes from one another. In FIG. 3, the monolayer 31 of the gate dielectric layer 3 is provided in the region of the thin film field effect transistor. By contrast, the dielectric polymer layer 32 covers both the monolayer 31 and the field dielectric 6.

Figure 4:
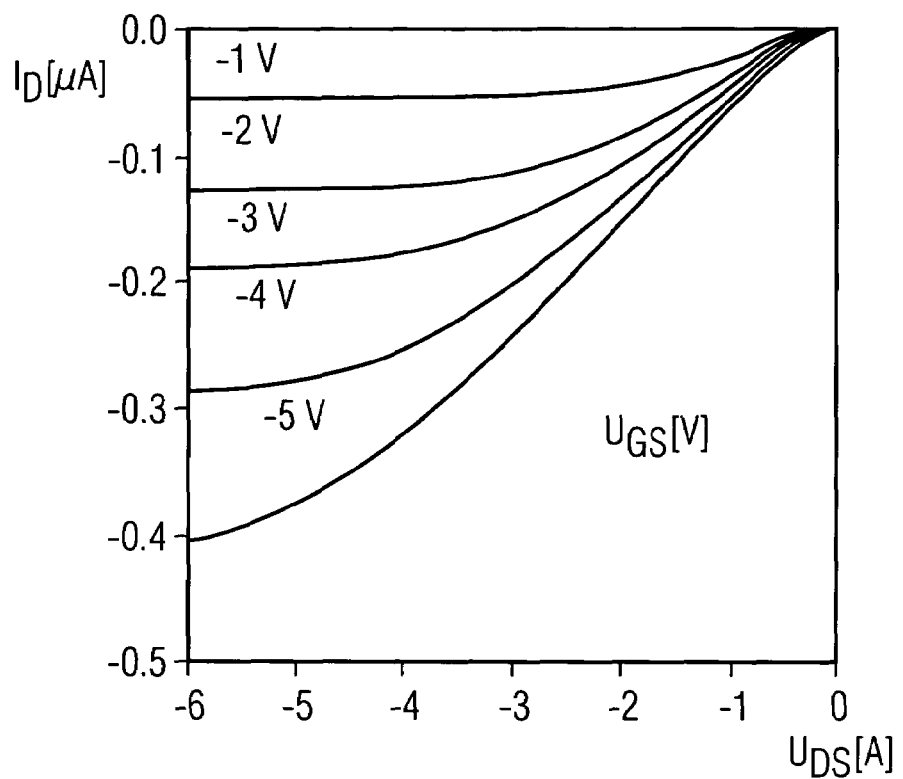
FIG. 4 shows an output characteristic curve of an organic thin film field effect transistor according to a fourth exemplary embodiment of the invention.
Figure 5:
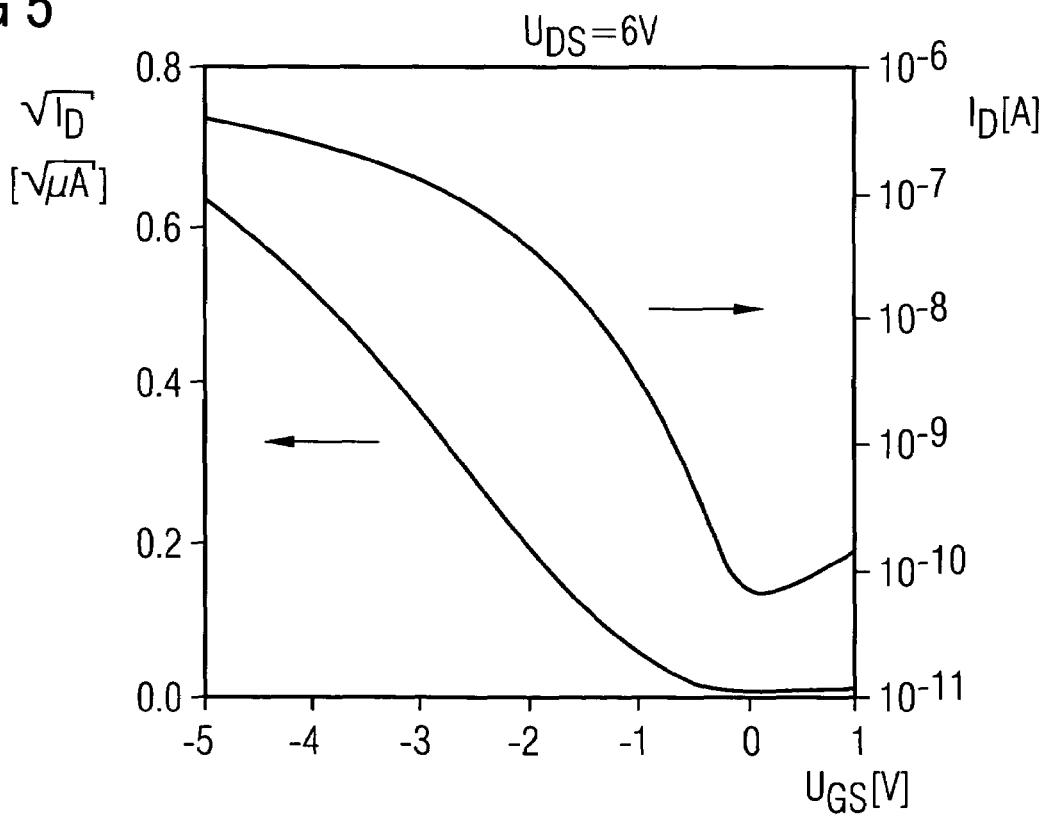
FIG. 5 shows a family of on-state characteristic curves of the thin film field effect transistor according to FIG. 4.

FIG. 4 shows the output characteristic curve of an organic field effect transistor having a gate electrode made of aluminum, a gate dielectric layer with a self assembling molecular monolayer having a thickness of 2.5 nanometers and a dielectric polymer layer having a thickness of 17 nanometers, source and drain contacts made of gold, and a semiconductor body made of pentacene. The channel width of the organic field effect transistor is 100 micrometers, and the channel length is 5 micrometers, for example.

At low supply voltages or a comparatively low drain-source voltage $U_{DS}$ of minus 2 volts, the drain current $I_D$ exhibits a dependence on the gate-source voltage $U_{GS}$.

Figure 6:
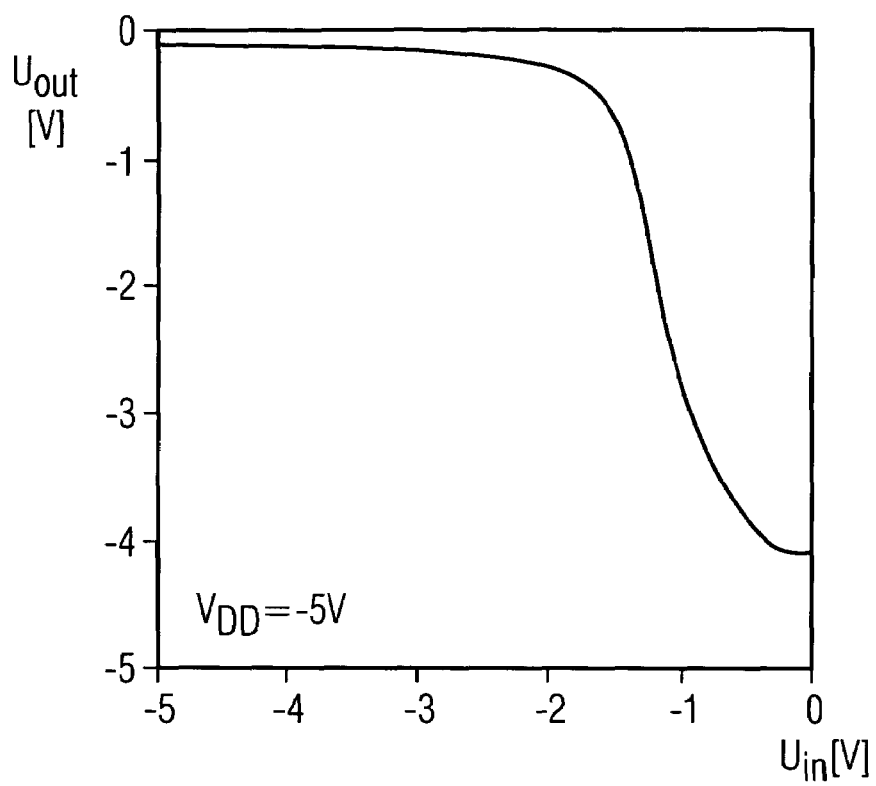
FIG. 6 shows an on-state characteristic curve of an inverter constructed with thin film field effect transistors according to a further exemplary embodiment of the invention.

FIG. 6 shows an on-state characteristic of an inverter constructed from organic field effect transistors with pentacene as semiconductor material and a two-layer gate dielectric.

The switching threshold of the inverter lies in the range of minus 0.5 V to minus 1.5 volts. In this case, the inverter requires a supply voltage of minus 5 volts for operation.

Figure 7:
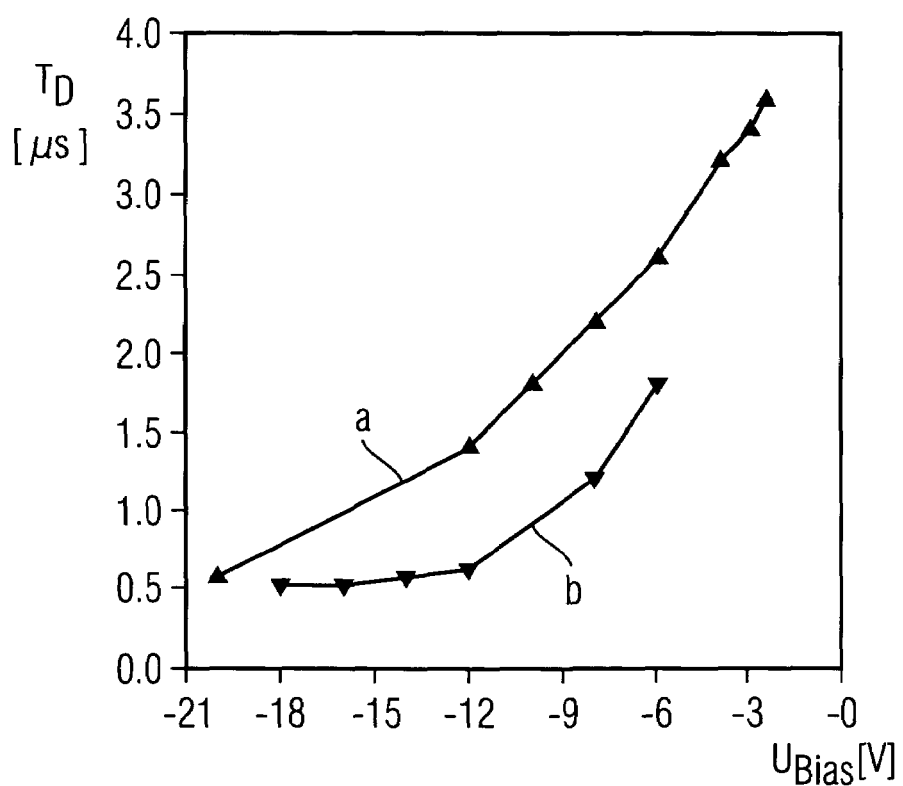
FIG. 7 shows the signal delay time of a ring oscillator with organic field effect transistors according to a next exemplary embodiment of the invention.

FIG. 7 indicates the dependence of an experimentally determined signal delay time of a five-stage ring oscillator without (a) and with (b) level shifting as a function of a bias voltage (Ubias). The ring oscillators are each constructed from organic thin film field effect transistors having a two-layer gate dielectric with a molecular monolayer and a dielectric polymer layer.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Carrier substrate
11 TFT region
12 Interconnect region
21 Gate electrode
22 Contact
3 Gate dielectric layer
31 Molecular monolayer
32 Dielectric polymer layer
41 Source electrode
42 Drain electrode
43 Bottom gold coating
44 Top gold coating
5 Semiconductor body
6 Field dielectric
7 Connecting line
UDS Drain-source voltage
UGS Gate-source voltage
ID Drain current
Uin Input voltage
Uout Output voltage
TD Stage delay
Ubias Bias voltage

What is claimed is:

1. A thin film field effect transistor, comprising:
    a gate electrode, a source electrode, and a drain electrode, each electrode being made of electrically conductive material;
    a semiconductor body of a semiconductor material arranged between the source electrode and the drain electrode, the semiconductor body including a charge carrier distribution disposed in a section of the semiconductor body controlled by a potential at the gate electrode; and
    a gate dielectric layer with a molecular self assembling monolayer, the gate dielectric layer spacing the semiconductor body apart from the gate electrode,
    wherein the gate dielectric layer is reinforced by at least a dielectric polymer layer made of an electrically insulating polymer.

2. The thin film field effect transistor as claimed in claim 1, wherein the thickness of the dielectric polymer layer is at least 5 nanometers.

3. The thin film field effect transistor as claimed in claim 2, wherein the dielectric polymer layer has a thickness in the range between 10 and 50 nanometers.

4. The thin film field effect transistor as claimed in claim 1, wherein the dielectric polymer is cross-linked.

5. The thin film field effect transistor as claimed in claim 1, wherein the dielectric polymer is poly-4-vinylphenol, a copolymer thereof, or polystyrene.

6. The thin film field effect transistor as claimed in claim 1, wherein the dielectric polymer layer is provided between the semiconductor body and the self assembling molecular monolayer.

7. The thin film field effect transistor as claimed in claim 1, wherein the material of the monolayer is a compound of the general formula $R_1Si(R_2)_3$, where $R_1$ is an alkyl group having 10 to 30 carbon atoms which may be substituted by one or more heteroatoms or aryl groups, and $R_2$ is a halogen or an alkoxy group derived from an alcohol having 1 to 4 carbon atoms.

8. The thin film field effect transistor as claimed in claim 1, wherein the semiconductor body is made of an organic semiconductor material.

9. The thin film field effect transistor as claimed in claim 8, wherein the organic semiconductor material is pentacene.

10. The thin film field effect transistor as claimed in claim 1, wherein the semiconductor body is made of an inorganic semiconductor material.

11. The thin film field effect transistor as claimed in claim 1, wherein the thin film field effect transistor is arranged on glass or a flexible film as a carrier substrate.

12. A thin film field effect transistor, comprising:
    a gate electrode, a source electrode, and a drain electrode, each electrode being made of electrically conductive material;
    a semiconductor body of a semiconductor material arranged between the source electrode and the drain electrode, the semiconductor body including a charge carrier distribution disposed in a section of the semiconductor body controlled by a potential at the gate electrode; and
    a gate dielectric layer with a molecular self assembling monolayer, the gate dielectric layer spacing the semiconductor body apart from the gate electrode, the monolayer being arranged on the gate electrode, the gate dielectric layer being reinforced by a dielectric polymer layer made of an electrically insulating polymer, wherein the thickness of the dielectric polymer layer is at least 5 nanometers.

13. The thin film field effect transistor as claimed in claim 12, wherein the dielectric polymer layer is applied from an organic solvent.

14. The thin film field effect transistor as claimed in claim 12, wherein the dielectric polymer layer is cross-linked.

* * * * *